(12) United States Patent
Lung

(10) Patent No.: US 7,397,060 B2
(45) Date of Patent: Jul. 8, 2008

(54) PIPE SHAPED PHASE CHANGE MEMORY

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/375,942

(22) Filed: Mar. 15, 2006

(65) Prior Publication Data

US 2007/0108429 A1    May 17, 2007

Related U.S. Application Data

(63) Continuation-in-part of application No. 11/333,061, filed on Jan. 17, 2006, now abandoned.

(60) Provisional application No. 60/736,424, filed on Nov. 14, 2005.

(51) Int. Cl.
*H01L 29/02* (2006.01)

(52) U.S. Cl. .................. 257/2; 257/1; 257/3; 257/4; 257/5; 438/800; 438/900

(58) Field of Classification Search .................. 257/2–5; 438/800, 900
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A * | 8/1998 | Zahorik et al. | ................ 438/95 |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |

(Continued)

OTHER PUBLICATIONS

"Thermal Conductivity of Crystalline Dielectrics" in CRC Handbook of Chemistry and Physics, Internet Version 2007, (87th edition), David R. Lide, ed., Taylor and Francis, Boca Raton FL.*

(Continued)

*Primary Examiner*—Jerome Jackson
*Assistant Examiner*—Jami M Valentine
(74) *Attorney, Agent, or Firm*—Haynes Beffel & Wolfeld LLP

(57) ABSTRACT

A memory cell device includes a bottom electrode, pipe shaped member comprising phase change material and a top electrode in contact with the pipe-shaped member. An electrically and thermally insulating material is inside the pipe-shaped member. An integrated circuit including an array of pipe-shaped phase change memory cells is described.

20 Claims, 8 Drawing Sheets

U.S. PATENT DOCUMENTS

| | | | |
|---|---|---|---|
| 5,958,358 A * | 9/1999 | Tenne et al. | 423/561.1 |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A * | 2/2000 | Harshfield | 257/734 |
| 6,034,882 A | 3/2000 | Johnson et al. | |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,563 B2 | 10/2004 | Xu | |
| 6,815,704 B1 | 11/2004 | Chen | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen | |
| 2004/0248339 A1 | 12/2004 | Lung | |
| 2005/0201182 A1 * | 9/2005 | Osada et al. | 365/230.03 |
| 2005/0215009 A1 | 9/2005 | Cho | |
| 2006/0110878 A1 * | 5/2006 | Lung et al. | 438/253 |
| 2007/0018149 A1 * | 1/2007 | Sato | 257/4 |

OTHER PUBLICATIONS

"Thermal Conductivity measurements of Thin Films Silicon Dioxide", (Proceedings of the IEEE 1989 International conference on Microelectronic test structures, vol. 2 No. 1 Mar. 1989, pp. 121-124).*

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era- vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

PIPE SHAPED PHASE CHANGE MEMORY

RELATED APPLICATION DATA

The benefit of U.S. Provisional Patent Application No. 60/736,424, filed 14 Nov. 2005, entitled PIPE PHASE CHANGE MEMORY AND MANUFACTURING METHOD, is hereby claimed.

The present application is a continuation-in-part of U.S. patent application Ser. No. 11/333,061 filed on 17 Jan. 2006, entitled PIPE SHAPED PHASE CHANGE MEMORY, now abandoned.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive material, like phase change based memory materials, and to methods for manufacturing such devices.

2. Description of Related Art

Chalcogenide materials are widely used in read-write optical disks. These materials have at least two solid phases, generally amorphous and generally crystalline. Laser pulses are used in read-write optical disks to switch between phases and to read the optical properties of the material after the phase change.

Chalcogenide materials also can be caused to change phase by application of electrical current. This property has generated interest in using programmable resistive material to form nonvolatile memory circuits.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

My U.S. Patent application Publication No. US-2004-0026686-A1 describes a phase change memory cell in which the phase change element comprises a side wall on an electrode/dielectric/electrode stack. Data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

Accordingly, an opportunity arises to devise methods and structures that form memory cells with structures that use small quantities of programmable resistive material using reliable and repeatable manufacturing techniques.

SUMMARY OF THE INVENTION

The present invention includes devices and methods to form memory cell devices including a bottom electrode, a fill layer over of the bottom electrode with a via extending from a top surface of the fill layer to the top surface of the bottom electrode, and a conformal layer of programmable resistive material, such as phase change material, within the via. The conformal layer contacts the bottom electrode and extends along the sides of the via to the top surface, forming a pipe-shaped member within the via. A top electrode in contact with the conformal layer lies over the fill layer. Electrically and thermally insulating material fills the balance of via. Representative insulating materials include a substantially evacuated void, or a solid material which has a low thermal conductivity, such as silicon dioxide, or a material that has even less than the thermal conductivity of silicon dioxide. According to yet other embodiments, where the programmable resistive material has a lower resistivity state and a higher resistivity state, the thermally insulating member comprises a material having a thermal conductivity less than that of the programmable resistive material in the higher resistivity state.

A method for manufacturing a pipe-shaped phase change memory cell is described that includes forming a bottom electrode having a top surface, and forming a fill layer over the electrode with a via extending from a top surface of the fill layer to the top surface of the bottom electrode. A conformal layer of programmable resistive material is deposited within the via, extending from the top surface of the bottom electrode along the sides of the via to the top surface of the fill. layer. Finally, a top electrode is formed in contact with the conformal layer over the fill layer. In an embodiment described herein, the steps of forming a bottom electrode and forming a fill layer include first forming the fill layer over a terminal of an access device. Then, the via is formed in the fill layer through the fill layer to the terminal. Then, the via is filled with a conductor to form a conductive plug. The conductor is then partially removed from the via, so that remaining portions of the conductive plug within the via act as the bottom electrode, and the portion of the via exposed by the removal of the conductor material act as the via within which the conformal layer is deposited.

An integrated circuit including a memory array is described comprising a plurality of such memory devices with access transistors, arranged in a high density array of rows and columns. The access transistors comprise source and drain regions in a semiconductor substrate, and a gate coupled to word lines along rows of memory cells. The memory cells are formed in a layer above the access transistors on the integrated circuit, with a bottom electrode contacting the drain of a corresponding access transistor. Bit lines are formed using a layer of metallization above the memory cells contacting the top electrodes on the memory devices along columns of memory cells in the array. In an embodiment described, two rows of memory cells share source contacts, with a common source line coupled to the source contact and extending generally parallel to the word lines through the array.

A reliable memory cell structure is provided with a low reset current, which is manufacturable using the standard lithographic and deposition processes, without requiring extraordinary techniques for forming sub-lithographic patterns. The cell structure is particularly suited to integration with CMOS circuitry on a large scale integrated circuit device.

Other aspects and advantages of the technology described herein can be understood with reference to the figures and the detailed description which follow.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
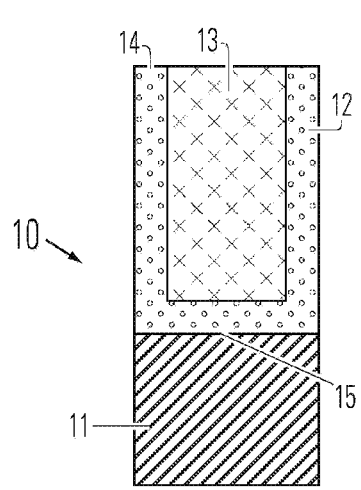
FIG. 1 is a cross-section via of an embodiment of a memory element based on a pipe-shaped member a programmable resistive material.

FIG. 1 is a simplified cross-sectional view of a pipe-shaped phase change memory cell 10. The cell includes a bottom electrode 11, and a pipe-shaped member 12 that comprises a programmable resistive material. The pipe-shaped member 12 is filled with an insulating material 13, which preferably has a low thermal conductivity. A top electrode (not shown) is formed in electrical communication with the top 14 of the pipe-shaped member. In the illustrated embodiment, the pipe-shaped member has a closed end 15 in electrical contact with a top surface of the bottom electrode 11. The fill 13 in the pipe-shaped cells may include silicon oxide, silicon oxynitride, silicon nitride, $Al_2O_3$, other low K (low permitivity) dielectrics, or an ONO or SONO multi-layer structure. Alternatively, the fill 13 may comprise an electrical insulator including one or more elements selected from the group consisting of Si, Ti, Al, Ta, N, O, and C. The thermally insulating fill 13 preferably has a thermal conductivity value "kappa" of less than that of silicon dioxide which is 0.014 J/cm*K*sec. In other preferred embodiments, the thermal insulator has a thermal conductivity less than that of the amorphous state of the phase change material, or less than about 0.003 J/cm*K*sec for a phase change material comprising GST. Representative materials for thermal insulator 42 include low permitivity (low-K) materials, including materials that are a combination of the elements silicon Si, carbon C, oxygen O, fluorine F, and hydrogen H. Examples of thermally insulating materials which are candidates for use as thermal insulator 42 include SiCOH, polyimide, polyamide, and fluorocarbon polymers. Other examples of materials which are candidates for use for thermal insulator 42 include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. A single layer or combination of layers can provide thermal insulation. A single layer or combination of layers within the pipe can provide thermal and electrical insulation.

Figure 14:
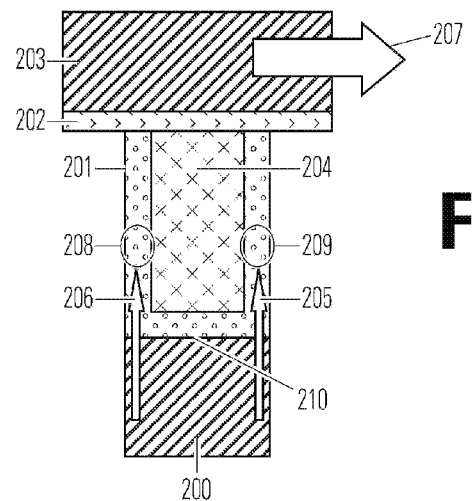
FIG. 14 illustrates a pipe-shaped phase change memory element used for description of current flow and the active region in the memory element.
Figure 16:
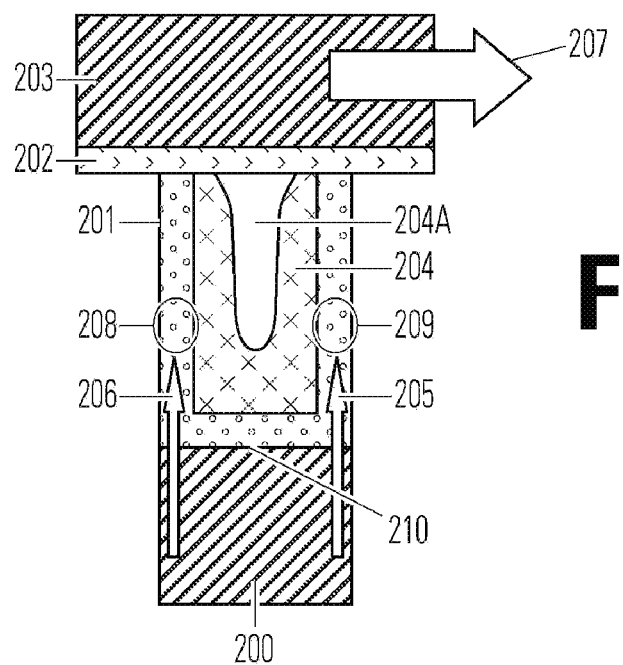
FIG. 16 illustrates a pipe-shaped phase change memory element with a thermally insulating void.

In an embodiment of the cell as illustrated in FIG. 16, the pipe-shaped member is not filled with a solid material, but rather is sealed by a top electrode 202 leaving a void 204A that is substantially evacuated and therefore has very low thermal conductivity. Reference to the description of FIG. 14 is made for a description of FIG. 16. FIG. 16 includes reference numerals identical to those of FIG. 14 for like components.

The pipe-shaped member 12 includes an inside surface 12a and an outside surface 12b, which are cylinder-like. Thus, the inside and outside surfaces 12a, 12b can be understood as basically cylindrical surfaces, classically defined as surfaces traced by a line moving parallel to a fixed line and intersecting a fixed curves, where for a circular cylinder the fixed line lies at the center of the pipe-shaped member and the fixed curve is a circle centered on the fixed line. The inside and outside surfaces 12a, 12b for this circular cylindrical shape would be defined by respective circles having radii that differ by the thickness of the wall of the pipe-shaped member, and thus define the inside and outside diameters of the pipe-shaped member. In embodiments of the pipe-shaped member, the cylinder-like shape has an outside perimeter that is circular, elliptical, rectangular or somewhat irregularly shaped, depending on the manufacturing technique applied to form the pipe-shaped member.

In embodiments described herein, the pipe-shaped member consists of a thin film formed on the sides of a via opened in a fill layer, similar to deposition of via liner materials like TiN thin films, used in the formation of tungsten plugs for the purpose of improving adhesion of the tungsten. Thus the walls of the pipe-shaped member can be very thin, as determined by the process used to deposit thin films in vias. Also, the bottom electrode 11 can comprise a conductor like tungsten deposited within the via.

Figure 2:
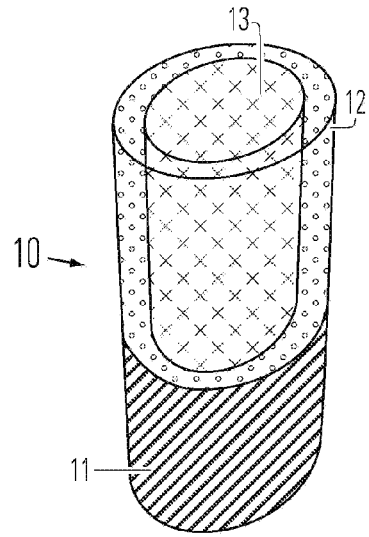
FIG. 2 is a perspective view of an embodiment of a memory element based on a pipe-shaped member of a programmable resistive material.

FIG. 2 shows the cell 10 of FIG. 1 in a perspective view, with a cut out showing the solid fill 13. The pipe-shaped member in FIG. 2 is cylindrical, with a circular perimeter shape. In alternative embodiments, the perimeter shape is basically square or rectangular. Generally, the perimeter shape of the pipe-shaped member 12 is determined by the shape of a via in which it is formed, and the process used to form the via.

A pipe-shaped cell 10 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the programmable resistive material comprises a phase change material, such as $Ge_2Sb_2Te_5$ or other materials described below. The region in the cell 10 that changes phase is small; and accordingly, the magnitude of the reset current required for changing the phase is very small.

Embodiments of the memory cell include phase change based memory materials, including chalcogenide based materials and other materials, for the pipe-shaped member 12. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997). More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Challecogenide Material $Ge_xSb_yTe_z$ x:y:z=2:2:5

Or other compositions with x: 0~5; y: 0~5; z: 0~10

GeSbTe with doping, such as N-, Si-, Ti-, or other element doping may also be used.

Formation method: By PVD sputtering or magnetron-sputtering method with reactive gases of Ar, $N_2$, and/or He, etc @ the pressure of 1 mtorr~100 mtorr. The deposition is usually done at room temperature. The collimater with aspect ratio of 1~5 can be used to improve the fill-in performance. To improve the fill-in performance, the DC bias of several ten to several hundred volts is also used. On the other hand, the combination of DC bias and the collimater can be used simultaneously.

The post deposition annealing treatment with vacuum or N2 ambient is sometimes needed to improve the crystallize state of challecogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (colossal Magnetoresistance) Material $Pr_xCa_yMnO_3$ x:y=0.5:0.5

Or other compositions with x: 0~1; y: 0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to~600 C, depending on the post deposition treatment condition. A collimater with an aspect ratio of 1~5 can be used to improve the fill-in performance. To improve the fill-in performance, the DC bias of several ten to several hundred volts is also used. On the other hand, the combination of DC bias and the collimater can be used simultaneously. A magnetic field of several tens of gauss to as much as a Tesla (10,000 gauss) may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound $Ni_xO_y$; $Ti_xO_y$; $Al_xO_y$; $W_xO_y$; $Zn_xO_y$; $Zr_xO_y$; $Cu_xO_y$; etc x:y=0.5:0.5

Other compositions with x: 0~1; y: 0~1

Formation method:

1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several ten to several hundred volts is also used. If desired, they combination of DC bias and the collimater can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several ten to several hundred volts is also used. If desired, the combination of DC bias and the collimater can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

In following sections of the disclosure, the phase change material is referred to as GST, and it will be understood that other types of phase change materials can be used. A material useful for implementation of a memory cell as described herein is $Ge_2Sb_2Te_5$.

Useful characteristics of the programmable resistive material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. Alternatively, it may be one of the other phase change materials identified above.

Figure 3:
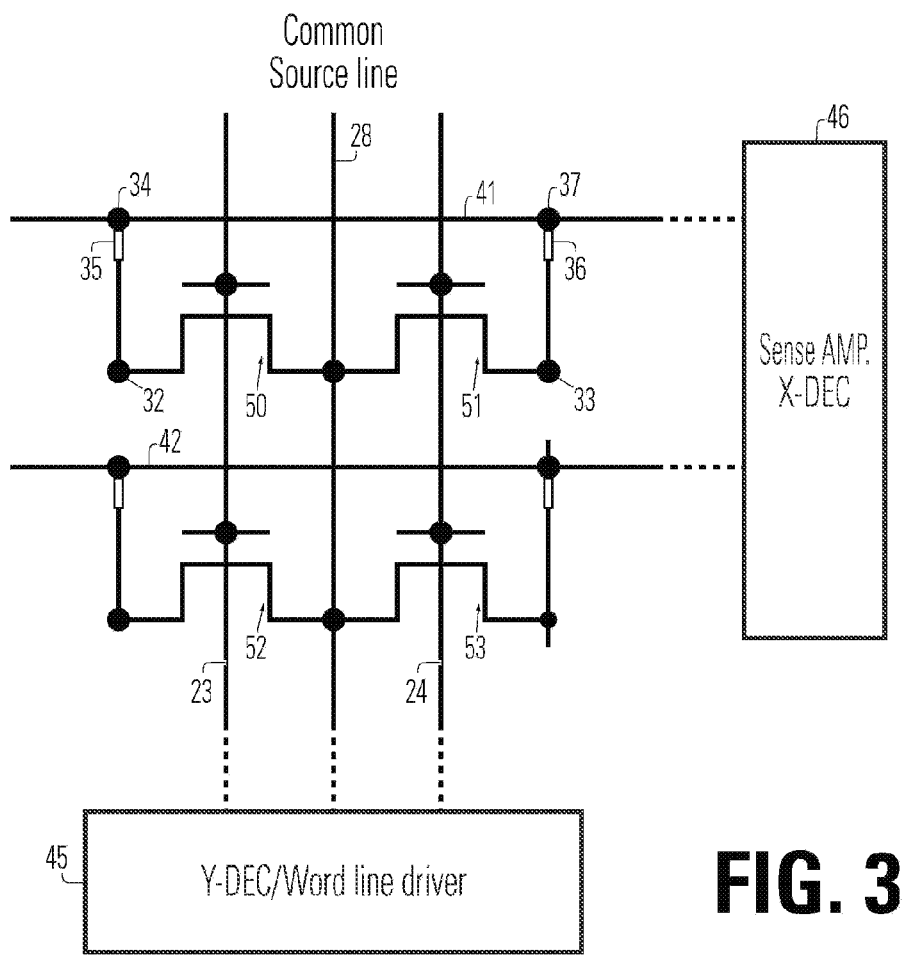
FIG. 3 is a circuit schematic of a memory array including memory elements like those shown in FIG. 1.

FIG. 3 is a schematic illustration of a memory array, which can be implemented as described herein. In the schematic illustration of FIG. 3, a common source line 28, a word line 23 and a word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and a set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the bottom electrode member 32 for pipe-shaped memory cell 35, which has top electrode member 34. The top electrode member 34 is coupled to the bit line 41. Likewise, the drain of access transistor 51 is coupled to the bottom electrode member 33 for pipe-shaped memory cell 36, which has top electrode member 37. The top electrode member 37 is coupled to the bit line 41. Access transistors 52 and 53 are coupled to corresponding pipe-shaped memory cells as well on bit line 42. It can be seen that the common source line 28 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 4:
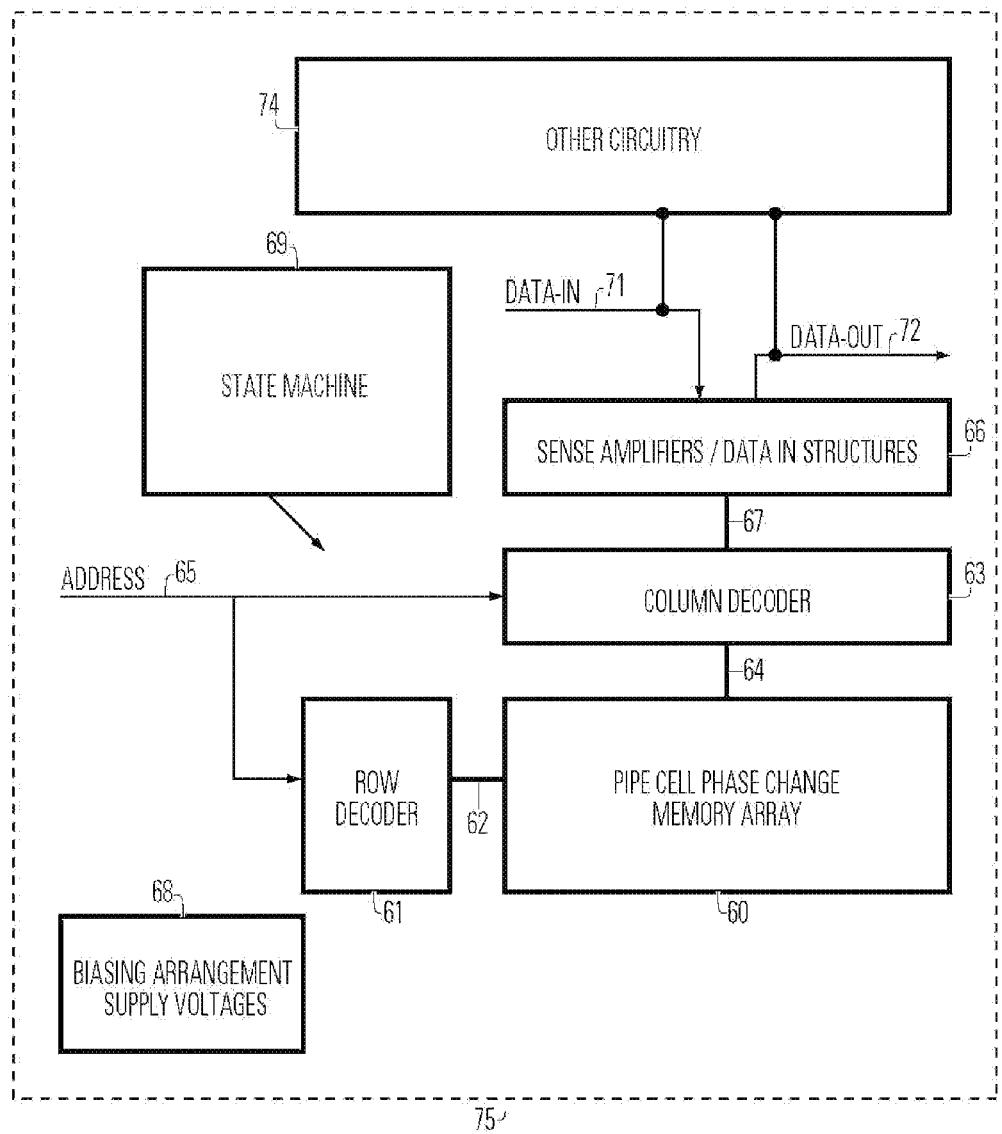
FIG. 4 is a block diagram of an integrated circuit device including a pipe-shaped phase change memory array and other circuitry.

FIG. 4 is a simplified block diagram of an integrated circuit according to an embodiment of the present invention. The integrated circuit 74 includes a memory array 60 implemented using pipe-shaped phase change memory cells, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the side wall pin memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 5:
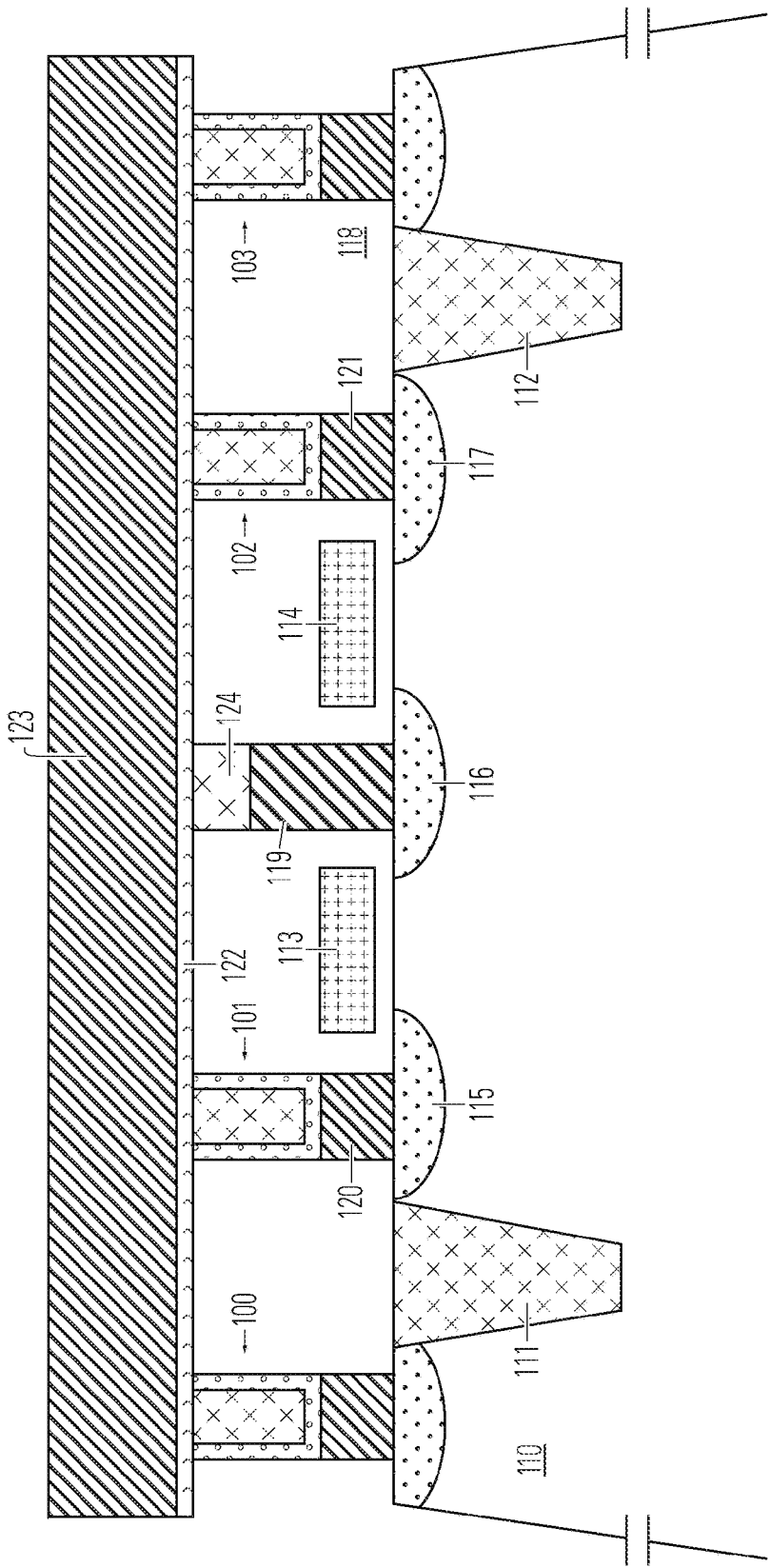
FIG. 5 is a cross-section of the final array structure for an embodiment of the invention.

FIG. 5 depicts a cross-section of a plurality of pipe-shaped phase change random access memory cells 100-103. The cells 100-103 are formed on a semiconductor substrate 110. Isolation structures such as shallow trench isolation STI dielectric trenches 111 and 112 isolate pairs of rows of memory cell access transistors. The access transistors are formed by common source region 116 in the substrate 110, and drain regions 115 and 117 in the substrate 110. Polysilicon word lines 113 and 114 form the gates of the access transistors. The dielectric fill layer 118 is formed over the polysilicon word lines 113, 114. Contact plug structures 121 and 120 contact individual access transistor drains, and common source line 119 contacts source regions along a row in the array. The common source line 119 contacts the common source region 116, and includes an insulator 124 isolating it from the metal layers 122, 123. The plug structure 120 acts as a bottom electrode of cell 101. The plug structure 121 acts as a bottom electrode of cell 102. The cell 101, like cells 100, 102 and 103, includes a pipe-shaped member comprising GST or another phase change material as described above with reference to FIG. 1. A patterned metal layer provides top electrodes for the cells 100-103, and includes a first contact layer 122 comprising a material used for contacting the GST, such as TiN, and a second layer 123 formed using standard metallization technology comprising for example Cu or Al based metals.

In representative embodiments, the plug structures comprises tungsten plugs. Other types of conductive plugs can be used as well, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O.

Figure 6:
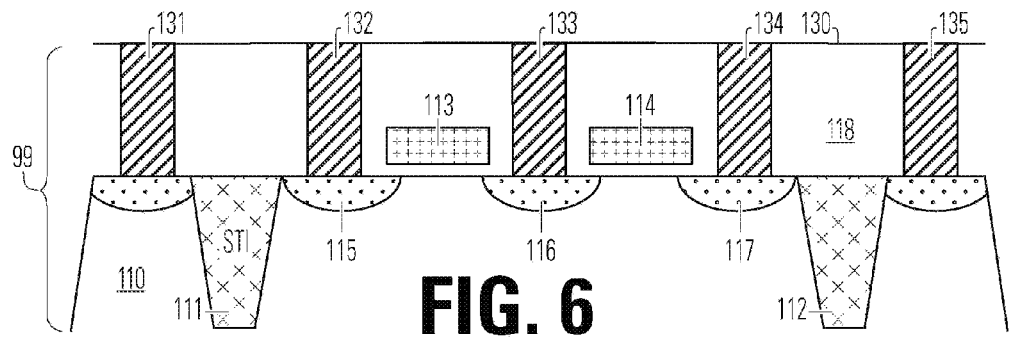
FIGS. 6-13 illustrate respective stages in a manufacturing process for a pipe-shaped, phase change memory element.

FIGS. 6-13 show stages of a manufacturing process for pipe-shaped memory cells as shown in FIG. 5. FIG. 6 illustrates a structure 99 after front-end-of-line processing, forming the standard CMOS components in the illustrated embodiment corresponding to the word lines, and the access transistors in the array shown in FIG. 5. In addition, plugs 131, 132, 134 and 135 are included, formed in corresponding vias that extend through a fill layer 118, from the top surface 130 of the fill layer to the drain terminals (115, 117) of corresponding access transistors. The metal line 133 is formed in a trench in the fill layer 118 and extends along rows of access transistors between word lines 113 and 114. The metal line 133 and the plugs 131, 132, 134 and 135 are formed using standard tungsten plug technology in an embodiment of the process, and have dimensions defined by the lithographic process used to pattern vias for the plugs. In FIG. 6, metal line 133 overlies doped region 116 in the semiconductor substrate, where the doped region 116 corresponds with the source terminal of a first access transistor on the left in the figure, and of a second access transistor on the right in the figure. At this stage, the metal line 133 extends to the top surface 130 of the fill layer 118. Doped region 115 corresponds with the drain terminal of the first access transistor. A word line including polysilicon 113, and silicide cap (not shown), acts as the gate of the first access transistor. Fill layer 118 comprises a dielectric such as silicon dioxide and overlies the polysilicon word line 113. Plug 132 contacts doped region 115, and extends to the surface 130 of the structure 99. The drain terminal of the second access transistor is provided by doped region 117. A word line including polysilicon line 114, and the silicide cap (not shown) acts as the gate for the second access transistor. Plug 134 contacts doped region 117 and extends to the top surface 130 of the structure 99. Isolation trenches 111 and 112 separate the two-transistor structure including drain terminals 115 and 117, from adjacent two-transistor structures.

Figure 7:
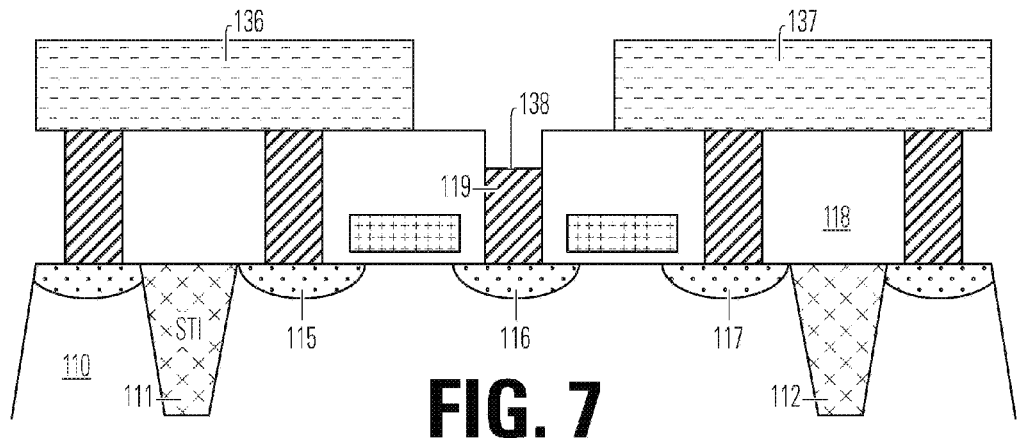
Figure 8:
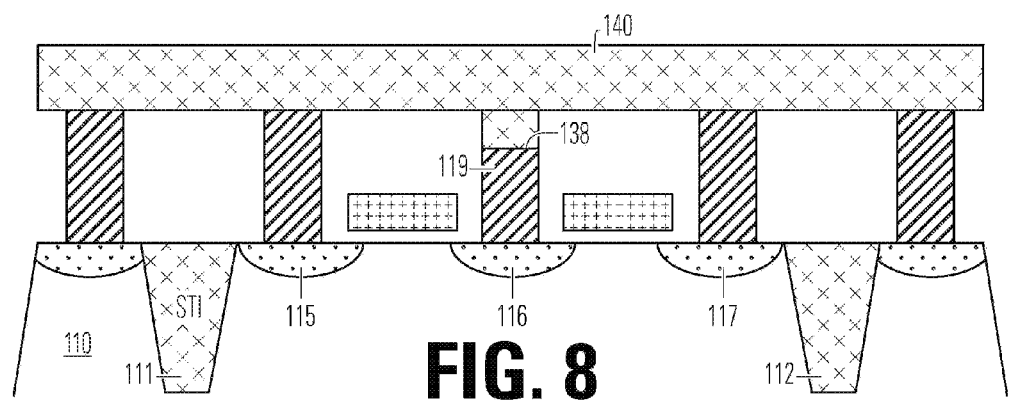

FIG. 7 shows a next stage in a manufacturing process. In the stage shown in FIG. 7, a photoresist pattern is formed comprising masks 136 and 137 using a standard lithographic process. The masks 136 and 137 protect the plugs 132, 133, 134, 135, and expose the top of the metal line 133. The top of the metal line 133 is etched back so that the surface 138 of the remaining structure is below the top surface 130 of the fill layer 118. The remaining structure becomes the source line 119 illustrated in FIG. 5. The etchback process can be executed using a fluorine based reactive ion etching for tungsten. After the etchback, the photoresist masks 136 and 137 are removed, and as shown in FIG. 8, an insulating fill 140 is deposited over the remaining structure, filling the trench over the source line 119. The insulating film may comprise silicon dioxide or other common dielectrics deposited using chemical vapor deposition, plasma enhanced chemical vapor deposition, high-density plasma chemical vapor deposition and the like as known in the art.

Figure 9:
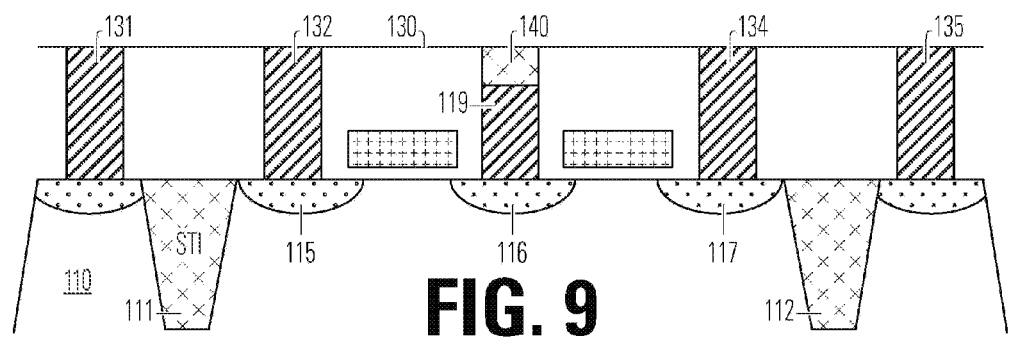

A next stage in the process is illustrated in FIG. 9, after removal of the insulating layer 140 by chemical mechanical polishing or otherwise, down to the surface 130 of the fill 118, while leaving a plug of the insulating material 140 over the source line 119.

Figure 10:
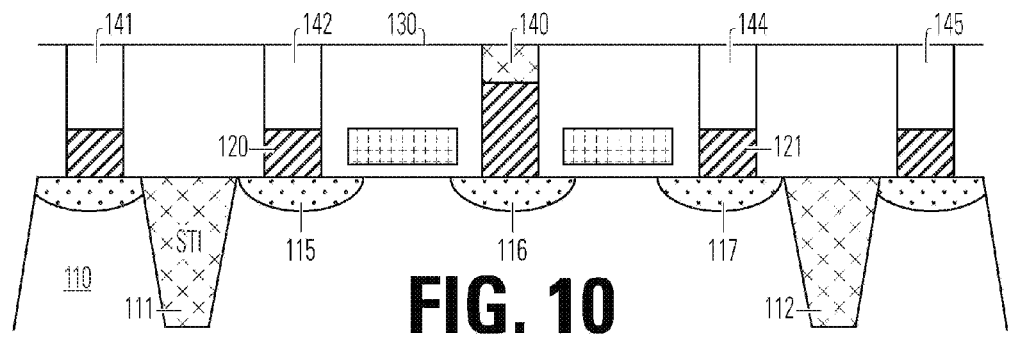

As shown in FIG. 10, in a next stage, an etchback is executed to remove metal from the plugs 131, 132, 134, 135 which are exposed after the polishing stage of FIG. 9. The etchback can be executed using a fluorine based reactive ion etching as discussed above for tungsten metal plugs. The etchback leaves vias 141, 142, 144, 145 over bottom electrodes 120, 121 formed by the remainder of the tungsten plugs left after the etchback process. The height of the plugs 120, 121 in a representative embodiment is about 100 nanometers, for a plug width of about 80 nanometers. The depth of the vias 141-145 remaining after the etchback is less than 200 nm in this example.

Figure 11:
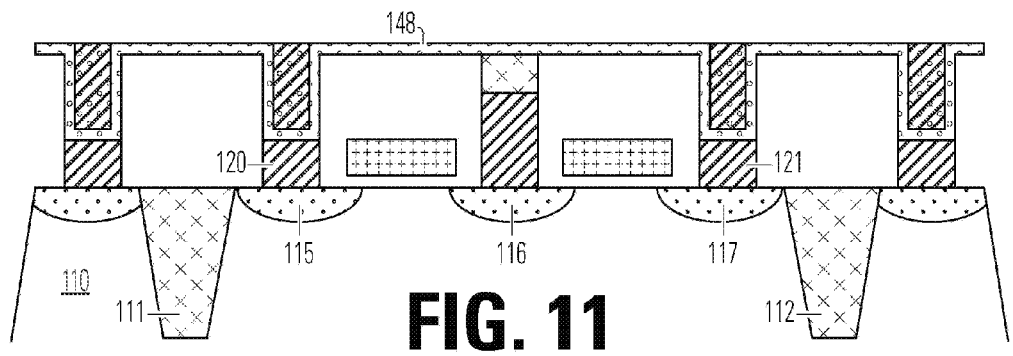

FIG. 11 illustrates a structure after depositing, by sputtering for example, a conformal layer 148 of GST, or other programmable resistive material, over the vias 141-145 in the fill layer. GST can be deposited using sputtering with collimation at about 250 degrees C. Alternatively, the GST can be deposited using a metal organic chemical vapor deposition (MO-CVD) process. In a representative embodiment, the conformal layer 148 comprises a thin film having a thickness on the top surface 130 of about 60 to 80 nanometers, a thickness on the side of the vias less than 30 nm, and typically between about 10 to 30 nanometers, and includes a layer in the bottom of the vias. The material is conformal on the walls of the vias, and so in the cross-section shown in FIG. 11, the shaded regions within the vias represent the fact that the material does not fill the via, but rather leaves pipe-shaped members on the walls of the via as described above. In alternative techniques, atomic layer deposition or chemical vapor deposition may be used to form the layer 148, depending on the programmable resistive material chosen, and the desired dimensions of the cell.

Figure 12:
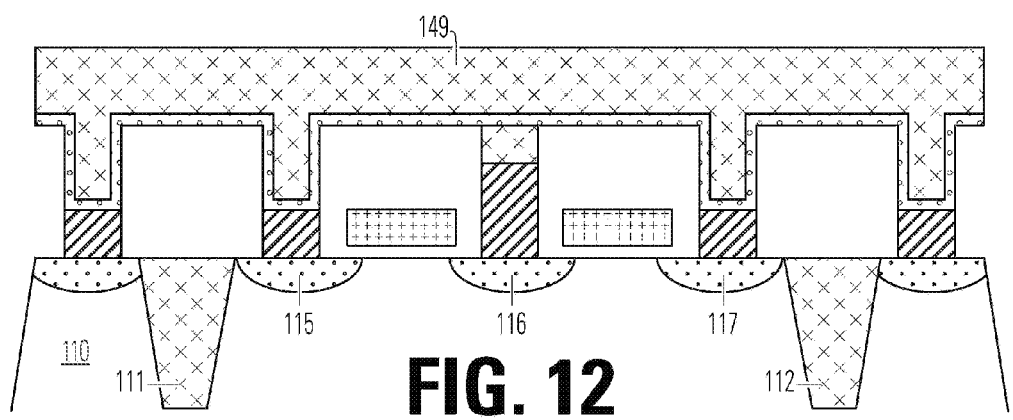

FIG. 12 shows a next stage, in which an insulating fill 149 is deposited over the structure shown in FIG. 11. In one embodiment, the fill 149 includes a low-temperature liner insulator, such as a silicon nitride layer or a silicon oxide layer (not shown), using a process temperature less than about 200 degrees C, over the programmable resistive material. One suitable low temperature process is to apply silicon dioxide using plasma enhanced chemical vapor deposition PECVD. After formation of the liner, the dielectric fill 149 is completed using a higher temperature process such as high-density plasma HDP CVD of a thermally insulating material as described above.

Figure 13:
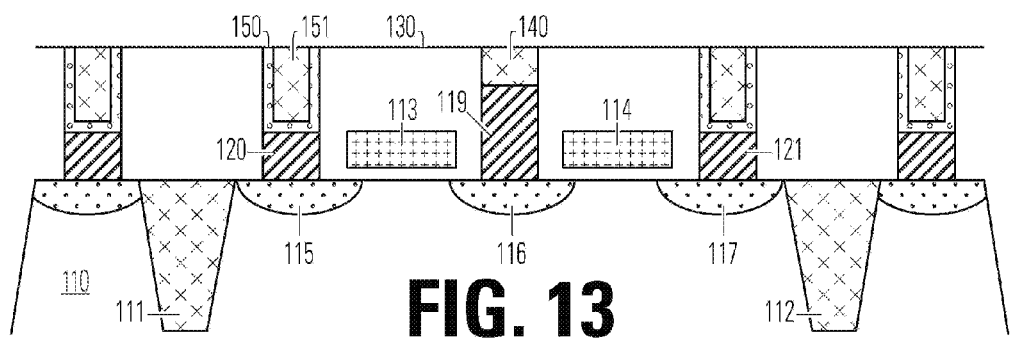

As illustrated in FIG. 13, an oxide chemical mechanical polishing CMP process is applied to planarize the structure at or near the surface 130, and to expose the tops (e.g. 150) of the pipe-shaped members, leaving insulating fill 151 within the pipe-shaped members, and exposing the insulator 140 over the source line 119. After the CMP, metallization is applied to define top electrodes using bit lines for example as shown in FIG. 5.

FIG. 14 shows a cross-section of a pipe-shaped phase change memory cell, including a bottom electrode 200, a pipe-shaped member 201 comprising a phase change material contacting the top surface 210 of the bottom electrode 200, a top electrode including contact layer 202 and bit line layer 203. The pipe-shaped member 201 is filled in this embodiment with a dielectric material 204 such as silicon dioxide, or more preferably, a dielectric material having a lower thermal conductivity than silicon dioxide, and more preferably having a lower thermal conductivity that that of the phase change material in the amorphous (higher resistivity) state. Arrows 205, 206 and 207 illustrate current flow during reset for the embodiment shown. The current flows from a terminal in an access device (not shown) in contact with the bottom electrode 200 up the sides of the pipe-shaped member 201, and out the metal line comprising layers 202 and 203. The active regions, generally in the locations represented by blocks 208, 209, in the phase change material in which the phase change occurs due to heat caused by the current flow, are located up the sides of the pipe-shaped member, away from the bottom electrode 200. This characteristic of the cell improves reliability by avoiding phase change at the interface between the bottom electrode 200 and the pipe-shaped member 201. Also, this characteristic establishes a small region in which the phase change material is active, reducing the magnitude of current needed for reset.

In embodiments described, the pipe-shaped member has sides that are continuous around the perimeter of the cell. In alternatives, deposition techniques could be used to make the pipe-shaped member discontinuous around the sides, further reducing the volume of phase change material in the active regions 208, 209.

Figure 15:
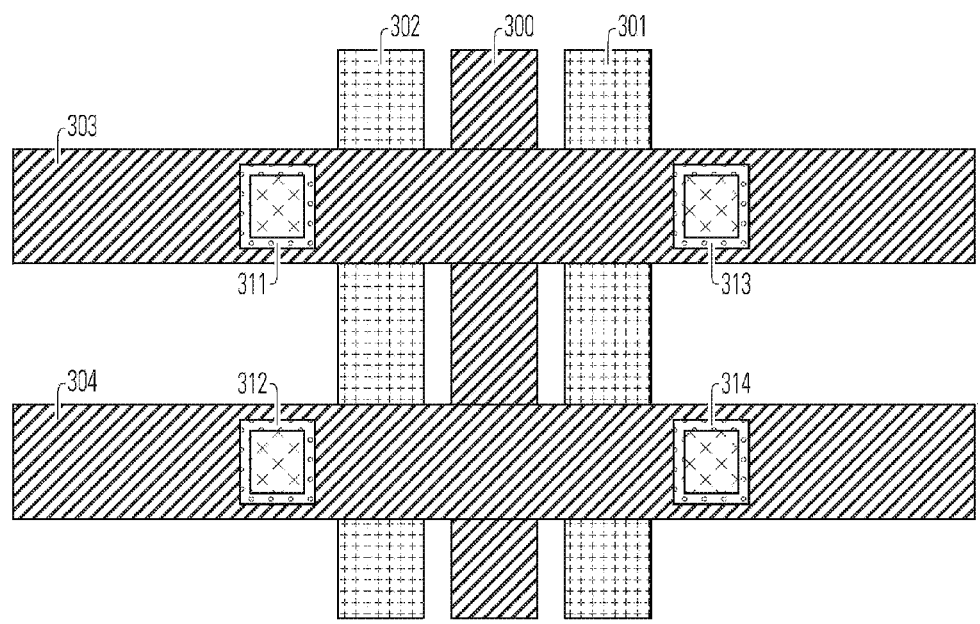
FIG. 15 shows a layout view of an array of pipe-shaped, phase change memory elements.

FIG. 15 shows a layout for a memory array comprising pipe-shaped phase change memory cells, like those shown in FIG. 5. The array includes a ground line 300, and two word lines 301, 302, arranged in parallel. Bit lines 303 and 304 are arranged orthogonally relative to the word lines 301, 302. Pipe-shaped phase change cells 311, 312, 313, 314 are located beneath the bit lines 303, 304, adjacent the word lines. As can be seen, the pipe-shaped members in this embodiment are square-cylindrical or rectangular-cylindrical. As discussed above, the pipe-shaped members can be circular-cylindrical or other shapes, depending on the manufacturing techniques applied during manufacture for the formation of vias. In preferred embodiments, the cells are manufactured using standard lithography, having dimensions corresponding with the minimum feature size of the process used for via formation, without requiring formation of sub-lithographic masks.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a pillar shaped structure including bottom electrode member having a top surface and sides, and a pipe-shaped member comprising a programmable resistive material, the pipe shaped member having a sidewall with an inside surface and an outside surface and having a top surface intersecting the sidewall, wherein the outside surface of the pipe-shaped member and the sides of the bottom electrode member are vertically aligned and have substantially equal widths at the top surface of the bottom electrode member;
   a dielectric body surrounding the pipe-shaped member and the sides of the bottom electrode member;
   a top electrode member in contact with the top surface of the pipe-shaped member; and
   a thermal insulator inside the inside surface of the pipe-shaped member, the thermally insulating member comprising a material having a thermal conductivity less than that of the top electrode member.

2. The memory device of claim 1, wherein the programmable resistive material has a lower resistivity state and a higher resistivity state, the thermally insulating member comprising a material having a thermal conductivity less than that of the programmable resistive material in the higher resistivity state.

3. The memory device of claim 1, wherein the pipe-shaped member has a cylindrical inside surface and an outside surface, and the thermal insulator includes a thermally insulating void beneath the top electrode inside the inside surface of the pipe-shaped member.

4. The memory device of claim 1, wherein the thermal insulator comprises a material having thermal conductivity less than 0.003 J/cm*K*sec.

5. The memory device of claim 1, wherein the thermal insulator comprises a material having thermal conductivity less than 0.014 J/cm*K*sec.

6. The memory device of claim 1, wherein the pipe-shaped member has a cylindrical inside surface and an outside surface, having a thickness between the inside surface and the outside surface less than 30 nm.

7. The memory device of claim 1, wherein the pillar shaped structure has depth from the top surface of the pipe-shaped member to the top surface of the bottom electrode less than 200 nm.

8. The memory device of claim 1, wherein the programmable resistive material comprises a chalcogenide.

9. The memory device of claim 1, wherein the programmable resistive material has at least two solid phases which are reversibly inducible by a current.

10. The memory device of claim 1, wherein the programmable resistive material has at least two solid phases which include a generally amorphous phase and a generally crystalline phase.

11. The memory device of claim 1, wherein the programmable resistive material comprises $Ge_2Sb_2Te_5$.

12. The memory device of claim 1, wherein the programmable resistive material comprises a combination of two or more materials from the group of Ge, Sb, Te, Se, In, Ti, Ga, Bi, Sn, Cu, Pd, Pb, Ag, S, or Au.

13. A memory device, comprising:
a pillar shaped structure including bottom electrode member having a top surface and sides, and a pipe-shaped member comprising a programmable resistive material, the pipe shaped member having a sidewall with an inside surface and an outside surface and having a top surface intersecting the sidewall, wherein the outside surface of the pipe-shaped member and the sides of the bottom electrode member are vertically aligned and have substantially equal widths at the top surface of the bottom electrode member;
a dielectric body surrounding the pipe-shaped member;
a top electrode member in contact with the top surface of the pipe-shaped member; and
a thermal insulator inside the inside surface of the pipe-shaped member, wherein the programmable resistive material has a lower resistivity state and a higher resistivity state, the thermally insulator comprising a material having a thermal conductivity less than that of the programmable resistive material in the higher resistivity state.

14. The memory device of claim 13, wherein the thermal insulator comprises a material having thermal conductivity less than 0.003 J/cm*K*sec.

15. An integrated circuit comprising:
a semiconductor substrate;
an array of access transistors having terminals including doped regions in the semiconductor substrate adapted to connect respective drain terminals to a reference potential;
a plurality of word lines coupled to gate terminals of access transistors along respective rows in the array of access transistors;
an array of programmable memory cells, the programmable memory cells in the array respectively comprising
a pillar shaped structure including bottom electrode member having a top surface and sides, and a pipe-shaped member comprising a programmable resistive material, the pipe shaped member having a sidewall with an inside surface and an outside surface and having a top surface intersecting the sidewall, wherein the outside surface of the pipe-shaped member and the sides of the bottom electrode member are vertically aligned and have substantially equal widths at the top surface of the bottom electrode member;
a dielectric body surrounding the pipe-shaped member and the sides of the bottom electrode member;
a top electrode member in contact with the top surface of the pipe-shaped member; and
a thermal insulator inside the inside surface of the pipe-shaped member, wherein the programmable resistive material has a lower resistivity state and a higher resistivity state, the thermally insulator comprises a material having a thermal conductivity less than that of the programmable resistive material in the higher resistivity state; and
a plurality of bit lines over the array of memory cells, arranged along respective columns of memory cells in the array of programmable memory cells and contacting or acting as the top electrodes.

16. The memory device of claim 15, wherein the pipe-shaped member has a cylindrical inside surface and an outside surface, and the thermal insulator includes a thermally insulating void beneath the top electrode inside the inside surface of the pipe-shaped member.

17. The memory device of claim 15, wherein the thermal insulator comprises a material having thermal conductivity less than 0.003 J/cm*K*sec.

18. The memory device of claim 15, wherein the programmable resistive material comprises a chalcogenide.

19. The memory device of claim 15, wherein the programmable resistive material has at least two solid phases which are reversibly inducible by a current.

20. The memory device of claim 15, wherein the programmable resistive material has at least two solid phases which include a generally amorphous phase and a generally crystalline phase.

* * * * *